(12) United States Patent
Kim (10) Patent No.: US 7,573,771 B2
(45) Date of Patent: Aug. 11, 2009

(54) HIGH VOLTAGE GENERATOR AND SEMICONDUCTOR MEMORY DEVICE

(75) Inventor: Kyung-Whan Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 264 days.

(21) Appl. No.: 11/528,531

(22) Filed: Sep. 28, 2006

(65) Prior Publication Data

US 2007/0070766 A1    Mar. 29, 2007

(30) Foreign Application Priority Data

Sep. 29, 2005    (KR) .................. 10-2005-0091672
Mar. 31, 2006    (KR) .................. 10-2006-0029651

(51) Int. Cl.
*G11C 7/00*    (2006.01)

(52) U.S. Cl. ............. 365/222; 365/189.06; 365/230.03; 365/233.5

(58) Field of Classification Search ................. 365/222, 365/189.06, 189.07, 230.03, 233.5, 226
See application file for complete search history.

(56) References Cited

U.S. PATENT DOCUMENTS 5,995,435 A    11/1999  Hamamoto et al.
6,141,279 A *  10/2000  Hur et al. ................ 365/222
7,042,774 B2 *  5/2006  Kim ...................... 365/189.11
7,123,079 B2 * 10/2006  Do ......................... 327/536
2005/0169088 A1  8/2005  Brox

FOREIGN PATENT DOCUMENTS

JP    11-086554    3/1999
KR    10-2005-0049631    5/2005

OTHER PUBLICATIONS

Korean Office Action issued in Korean Patent Application No. 2006-0029651, dated Mar. 31, 2007.

* cited by examiner

*Primary Examiner*—Pho M. Luu
(74) *Attorney, Agent, or Firm*—Mannava & Kang, P.C.

(57) ABSTRACT

A high voltage generator includes: a high voltage detecting unit for detecting a level of a high voltage and outputting a high enable signal; an auto refresh control unit for enabling an auto refresh high enable signal in response to a detection signal enabled when a level of a power supplying voltage is lower than a certain level and in response to the pumping enable signal during an auto refresh operation; and a high voltage generating unit for generating a high voltage by performing a pumping operation in response to the auto refresh pumping enable signal.

26 Claims, 5 Drawing Sheets

HIGH VOLTAGE GENERATOR AND SEMICONDUCTOR MEMORY DEVICE

FIELD OF THE INVENTION

The present invention relates to a high voltage generator and a semiconductor memory device including the same; and more particularly, to a high voltage generator capable of improving a driving force of a high voltage and properly consuming power at the high voltage, and a semiconductor memory device including the same.

DESCRIPTION OF RELATED ARTS

Typically, a semiconductor memory device may be embodied by dynamic random access memory (DRAM) device or a static random access memory (SRAM) device. Since a unit cell of the SRAM device is formed with four transistors, stored data therein can be maintained without loss if power is not off. Accordingly, a refresh operation which refreshes the stored data is not required.

However, a unit cell of the DRAM device is formed of a transistor and a capacitor, and stores data in the capacitor. Because of a characteristic of the capacitor, electric charges indicating the stored data of the capacitor are gradually reduced as time passes. Accordingly, a refresh operation which refreshes the stored data in the memory cell at predetermined periods is required to continuously maintain the stored data in the memory cell.

The refresh operation is performed through a series of the following steps. Each of a plurality of word lines is sequentially selected every predetermined period. The electric charges stored in capacitors corresponding to the selected word line are refreshed by a detection amplifying means. Through the above described series, the data can be maintained without causing a loss of electric charges in the memory cell.

Previously, the refresh operation has been performed by using a method in which necessary commands and addresses are externally input. However, more recently the refresh operation is performed by using a method in which the necessary command and addresses are generated by an internal circuit, thereby simplifying control of the semiconductor memory device.

An auto refresh mode or a self refresh mode is an example of the refresh operation performed by generating the addresses at the internal circuit.

The DRAM device selects the self refresh mode to consume low power. The self refresh mode generates a row address strobe (RAS) signal /RAS used as a refresh synchronous signal at the internal device. After a column address signal (CAS) signal /CAS is generated prior to the RAS signal /RAS, the self refresh mode is performed.

If the self refresh mode is started, the refresh operation is performed by a refresh counter every predetermined period. As for the performing of the self refresh mode, a refresh controller receives address information generated from the refresh counter and generates row addresses. Then, the word lines corresponding to the row addresses are enabled.

The auto refresh mode is a method in which the refresh counter in the memory device generates row addresses instead of using externally received refresh addresses. The refresh operation is performed by using an address generated by the refresh controller, ignoring an address received from the external at the auto refresh mode. At the auto refresh mode, a refresh command is periodically externally input.

The high voltage generator installed in the semiconductor memory device supplies a high voltage much higher than a power supply voltage, thus consuming relatively high power.

Figure 1:
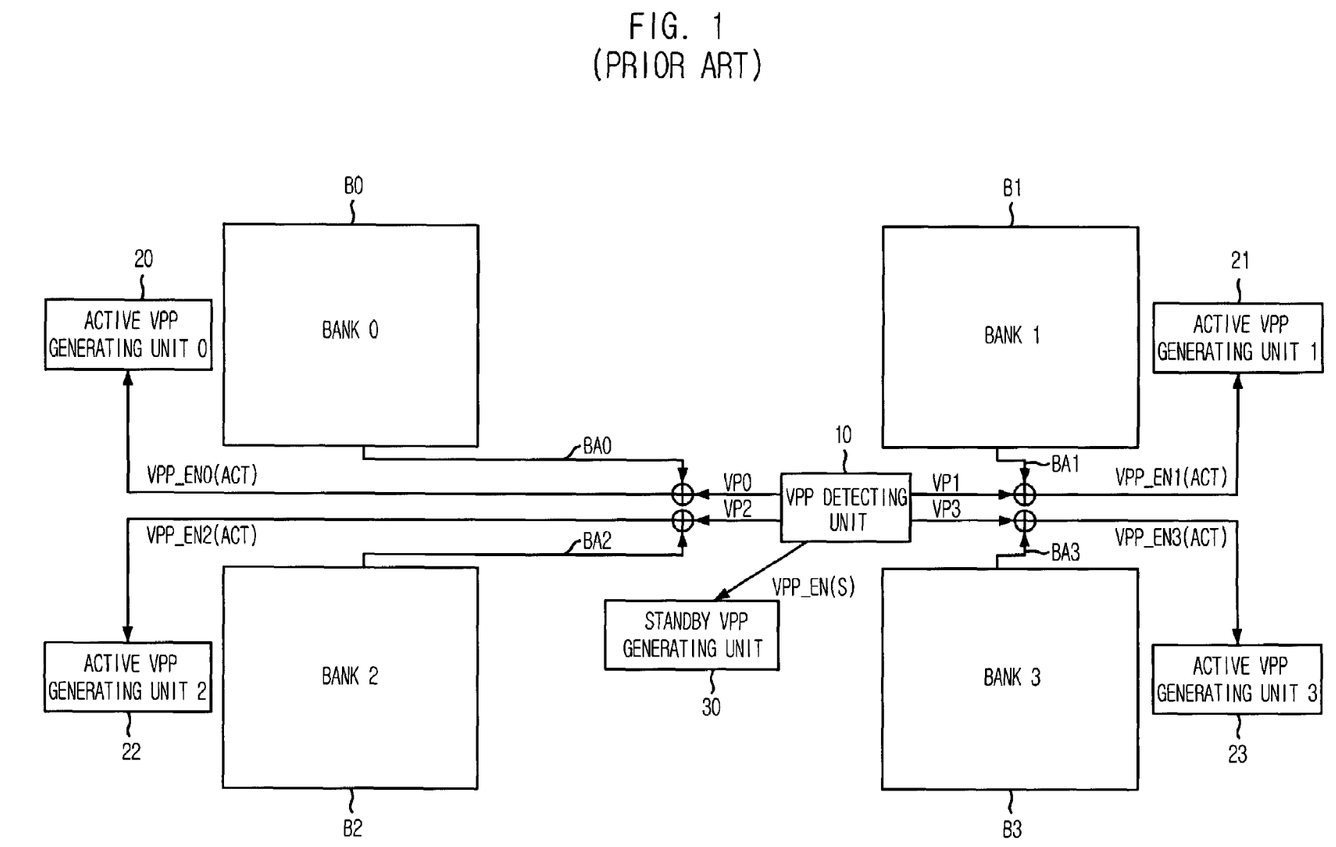
FIG. 1 is a block diagram of a typical semiconductor memory device.

FIG. 1 is a block diagram illustrating a typical semiconductor memory device.

The DRAM device includes a VPP detecting unit 10; a plurality of active VPP generating units 20 to 23; a standby VPP generating unit 30; and a plurality of banks B0 to B3.

The VPP detecting unit 10 detects whether a high voltage VPP reaches a target level and outputs a high enable signal VPP_EN(S). The standby VPP generating unit 30 operates according to whether the high enable signal VPP_EN(S) is enabled or not. That is, the standby VPP generating unit 30 operates according to the high enable signal VPP_EN(S) regardless of whether the banks B0 to B3 are enabled or not.

The active VPP generating units 20 to 23 can operate according to a plurality of high enable signals VPP_EN0 to VPP_EN3 respectively generated from a combination of outputs VP0 to VP3 of the VPP detecting unit 10 and signals BA0 to BA3 determining whether the banks B0 to B3 are enabled or not.

In a typical semiconductor memory device, one or more of the active VPP generating units 20 to 23 are assigned to each one of the banks B0 to B3. An IDD5 current is consumed in performing an auto refresh operation. In the DRAM operation, the largest amount of current is consumed in performing an auto refresh operation. In the DRAM operation, the high voltage is required in all of the banks BA0 to BA3 when the auto refresh operation is performed. The high voltage is used to drive the word lines.

Since the banks B0 to B3 are enabled during the auto refresh operation in the DRAM operation mode, the high voltage VPP is used in all of the banks B0 to B3. A large amount of electrical charges are consumed to generate the high voltage VPP in the auto refresh operation. Accordingly, current used in the auto refresh operation is abruptly increased and, thus, an operating voltage level of the semiconductor memory device is dropped. This phenomenon occurs when a voltage level of the power supply voltage is low.

If a level of the operating voltage of the semiconductor memory device drops, the high voltage VPP, generated according to the level of the power supply voltage, may not reach a target level. That is, if the amount of electric charges consumed to generate the high voltage VPP greatly increases, the level of the power supply voltage abruptly drops. Accordingly, the high voltage VPP cannot reach the target level due to the dropped level of the power supply voltage.

Figure 2:
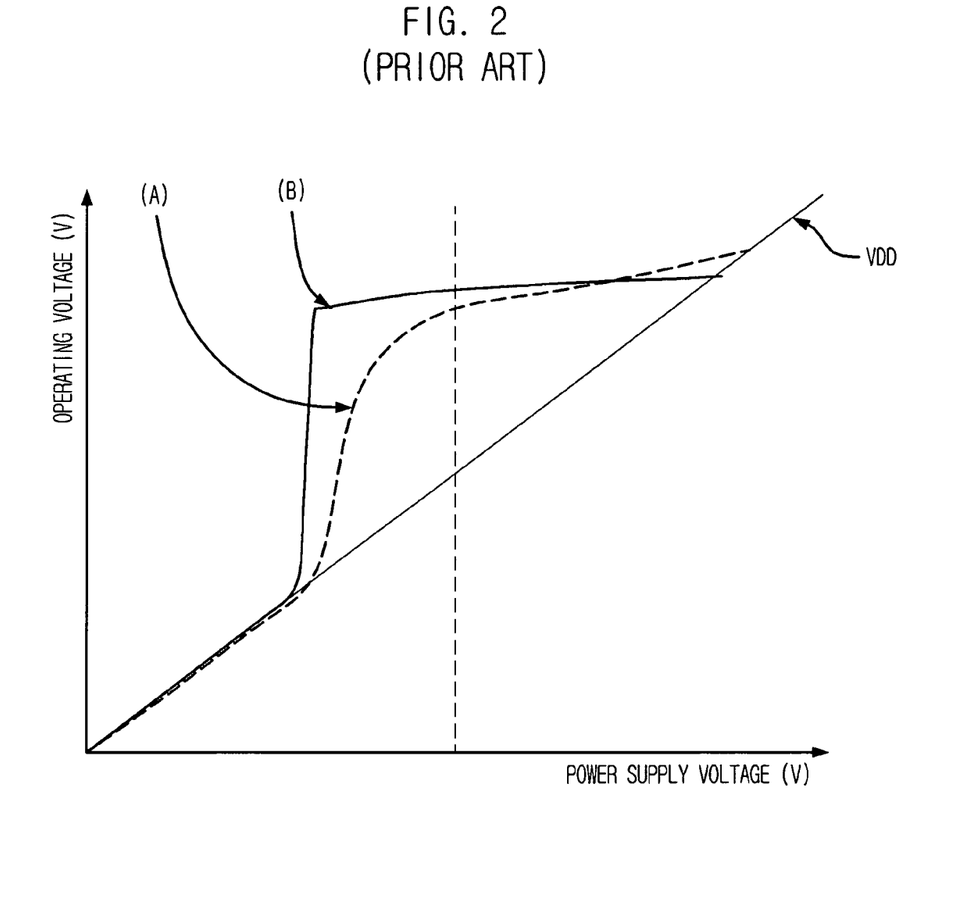
FIG. 2 is a graph illustrating a high voltage operation of the device of FIG. 1.

FIG. 2 is a graph illustrating a high voltage VPP changing with an active mode and a standby mode.

In case of an auto refresh operation, a level of electric charges (A) of the high voltage VPP does not reach a target level (B) when a power supply voltage is low.

When the high voltage VPP is generated, if an amount of electric charges pumped is increased to improve the above described phenomenon, a circuit area of the active VPP generating units must be increased. Furthermore, if the power supply voltage supplied to the semiconductor memory device is increased, the amount of electric charges consumed to generate the high voltage is excessively increased. Accordingly, unnecessary power may be consumed.

SUMMARY OF THE INVENTION

It is, therefore, an object of the present invention to provide a high voltage generator, wherein the high voltage generator is enabled regardless of whether a certain bank is enabled or not if a power supply voltage is lower during an auto refresh operation and thus, a driving force of a high voltage is improved during the auto refresh operation mode.

In accordance with one aspect of the present invention, there is provided a high voltage generator, including: a high voltage detecting unit for detecting a level of a high voltage and outputting a high enable signal; an auto refresh control unit for enabling an auto refresh high enable signal in response to a detection signal enabled when a level of a power supplying voltage is lower than a certain level and in response to the pumping enable signal during an auto refresh operation; and a high voltage generating unit for generating a high voltage by performing a pumping operation in response to the auto refresh pumping enable signal.

In accordance with another aspect of the present invention, there is provided a high voltage generator, including: a high voltage generating unit for generating a high voltage by performing a pumping operation in response to an auto refresh pumping enable signal and a result of comparing the high voltage with a reference voltage; and a plurality of banks including a plurality of memory cell arrays and supplying the high voltage to the memory cell arrays.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

Figure 3:
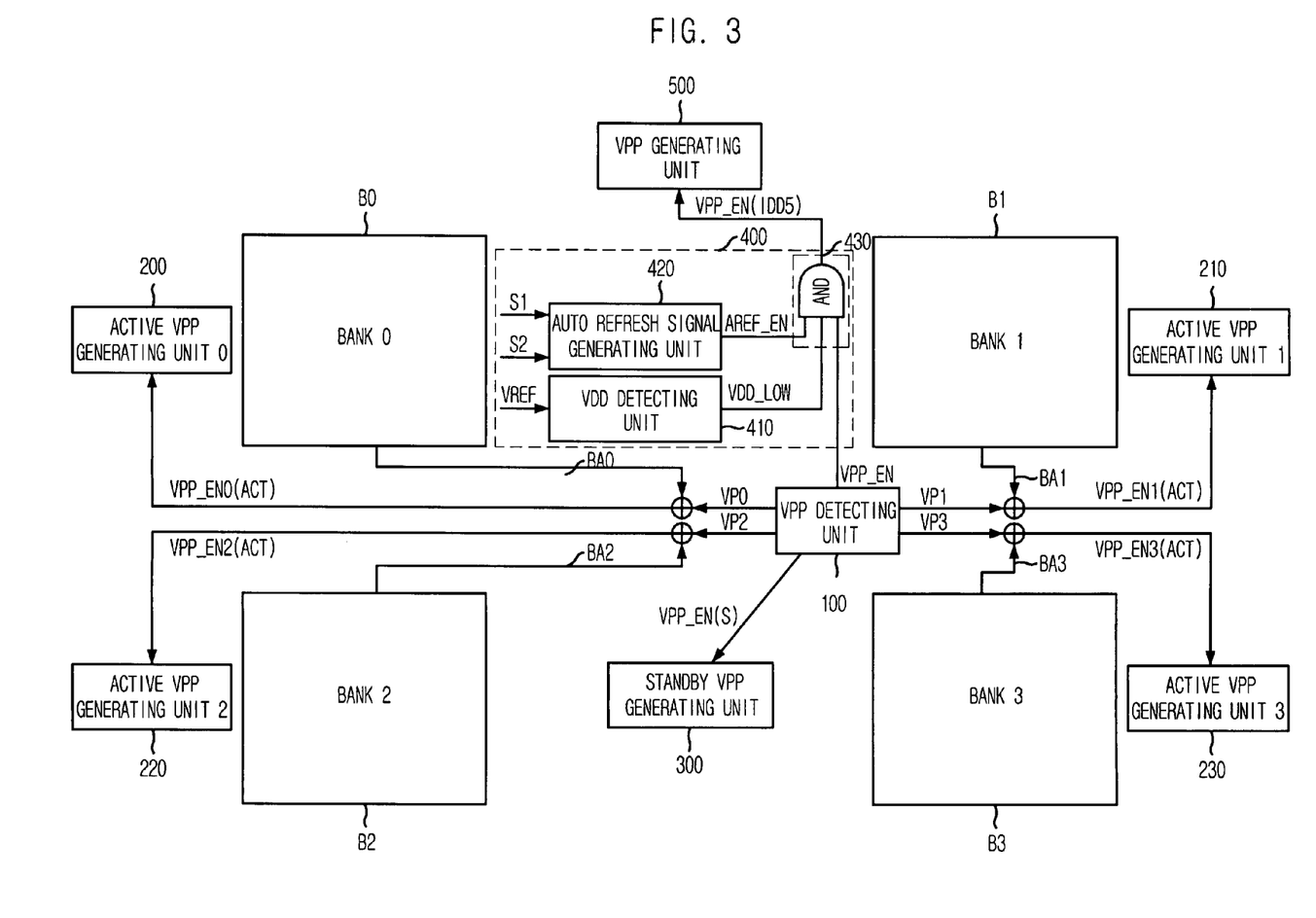
FIG. 3 is a block diagram of a semiconductor memory device in accordance with an embodiment of the present invention.

FIG. 3 is a block diagram of a semiconductor memory device in accordance with an embodiment of the present invention.

The semiconductor memory device in accordance with the embodiment of the present invention includes a VPP detecting unit 100, a plurality of active VPP generating units 200 to 230, a standby VPP generating unit 300, an auto refresh control unit 400, and a VPP generating unit 500.

The VPP detecting unit 100 detects whether a high voltage VPP reaches a target level or not, and outputs a high enable signal VPP_EN(S). The standby VPP generating unit 300 operates according to whether the high enable signal VPP_EN(S) is enabled or not. That is, the standby VPP generating unit 300 operates according to the high enable signal VPP_EN(S) if the high voltage VPP does not reach the target level, regardless of whether a plurality of banks B0 to B3 are enabled or not.

The active VPP generating units 200 to 230 operate according to a plurality of high enable signals VPP_EN0 to VPP_EN3 generated by a combination of outputs VP0 to VP3 of the VPP detecting unit 100, and the signals BA0 to BA3 determining whether the banks B0 to B3 are enabled or not based on bank enablement information BA0 to BA3.

One or more of the active VPP generating units 200 to 230 are assigned to each one of the banks B0 to B3. The banks B0 to B3 include a plurality of memory cell arrays. The active VPP generating units 200 to 230 supplies a high voltage in response to the high enable signals VPP_EN0 to VPP_EN3.

The auto refresh control unit 400 includes a VDD detecting unit 410, an auto refresh signal generating unit 420, and an enable signal generating unit 430.

The VDD detecting unit 410 compares a level of a power supply voltage VDD with a preset reference voltage VREF and outputs a detection signal VDD_LOW. The auto refresh generating unit 420 generates an auto refresh signal AREF_EN according to a bank active signal S1 and a refresh command signal S2.

The enable signal generating unit 430 includes an AND gate AND which logically combines the high enable signal VPP_EN input from the high voltage detecting unit 100, the detection signal VDD_LOW and the auto refresh signal AREF_EN. The enable signal generating unit 430 also generates an auto refresh high enable signal VDD_EN(IDD5).

The high voltage generating unit 500 performs a pumping operation according to the auto refresh high enable signal VDD_EN(IDD5) during the auto refresh operation regardless of whether the banks B0 to B3 are enabled or not.

Figure 4A:
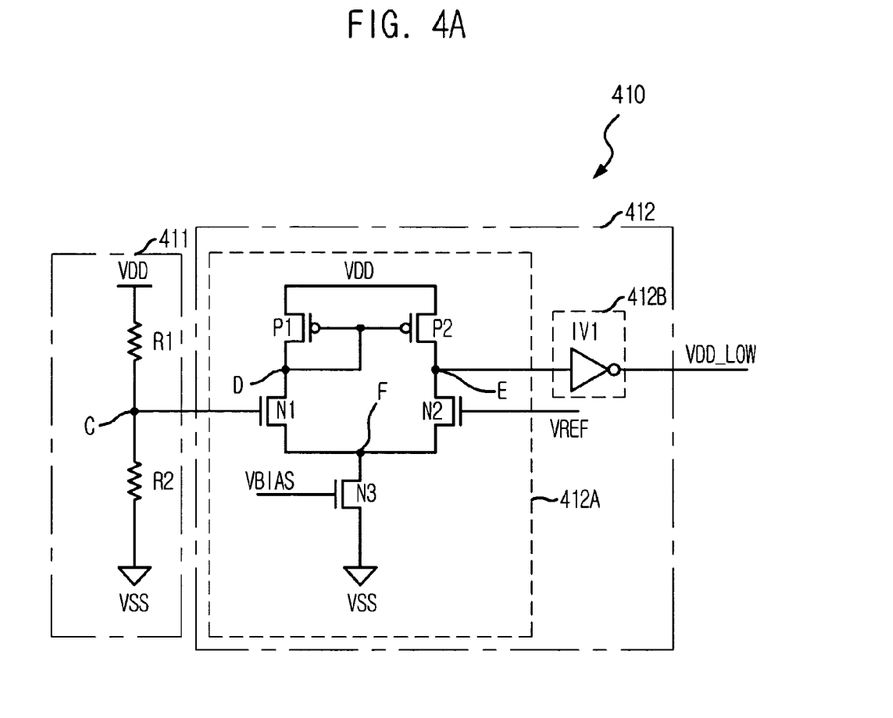
FIG. 4A is a circuit diagram of a VDD detecting unit shown in FIG. 3.
Figure 4B:
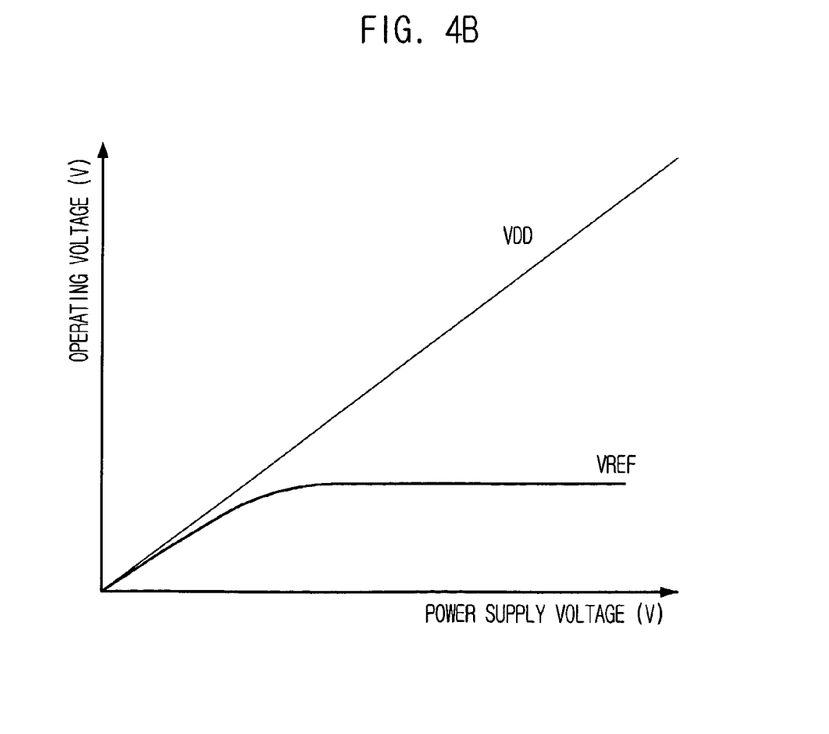
FIG. 4B is a graph illustrating a reference voltage of the VDD detecting unit shown in FIG. 4A.

FIG. 4A is a circuit diagram of the VDD detecting unit 410 shown in FIG. 3 and FIG. 4B is a graph illustrating a reference voltage of the VDD detecting unit 410 shown in FIG. 4A.

The VDD detecting unit 410 includes a plurality of resistances R1 and R2, a plurality of P-type metal oxide semiconductor (PMOS) transistors P1 and P2, a plurality of N-type metal oxide semiconductor (NMOS) transistors N1 to N3, and an inverter IV1. The resistances R1 and R2 are coupled in series between a VDD terminal and a ground voltage terminal.

A resistance dividing unit 411 divides the power supply voltage VDD, and a comparing unit 412 compares an output of the resistance dividing unit and the reference voltage VREF. The comparing unit 412 includes a differential amplifier 412A and a reversing unit 412B. The differential amplifier 412A compares an output of the resistance dividing unit 411 with the reference voltage VREF when a bias signal VBIAS is enabled. The reversing unit 412B reverses an output of the differential amplifier 412B and outputs the detection signal VDD_LOW.

The PMOS transistors P1 and P2 are respectively arranged between the VDD terminal and a node D and between the VDD terminal and a node E, and gate terminals thereof are commonly coupled to a node D. The NMOS transistors N1 and N2 are coupled to a node F, and the NMOS transistor N2 receives a reference voltage VREF through a gate terminal.

The NMOS transistor N3 is coupled to the common node F of the NMOS transistors N1 and N2 and the ground voltage terminal, and receives the bias signal VBIAS through a gate terminal. The inverter IV1 reverses a signal of the node E and outputs a detection signal VDD_LOW.

As shown in FIG. 4B, the reference voltage VREF is maintained at a predetermined voltage level regardless of variation in a level of the power supply voltage VDD.

Figure 5A:
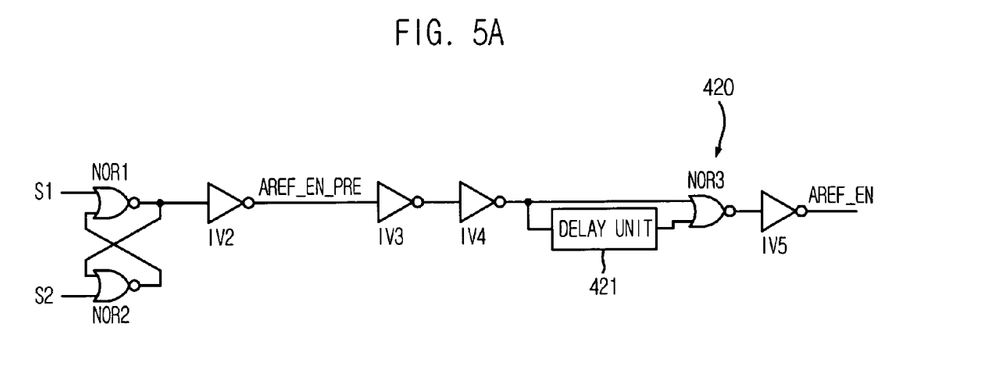
FIG. 5A is a circuit diagram of an auto refresh signal generating unit shown in FIG. 3.
Figure 5B:
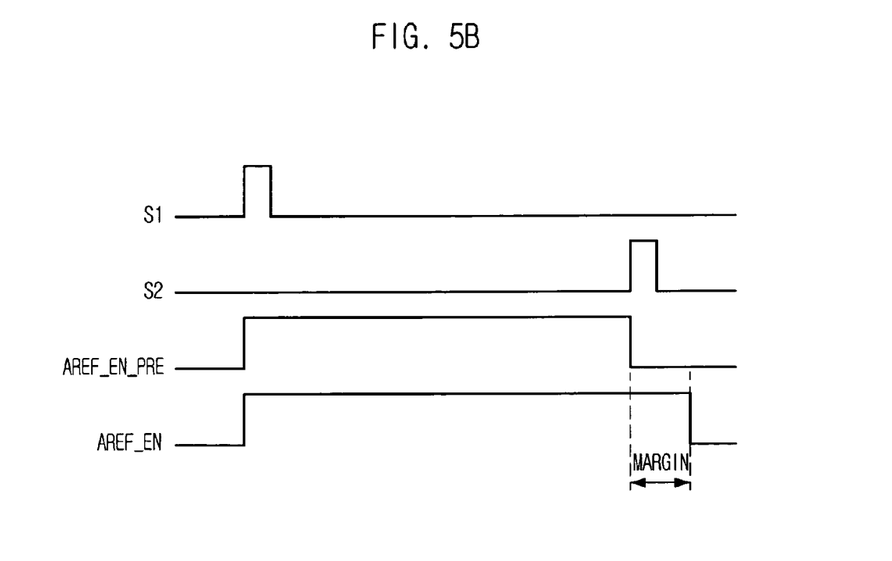
FIG. 5B is a graph illustrating signals of the auto refresh signal generating unit shown in FIG. 5A.

FIG. 5A is a circuit diagram of an auto refresh signal generating unit 420 shown in FIG. 3 and FIG. 5B is a graph illustrating signals of the auto refresh signal generating unit 420 shown in FIG. 5A.

The auto refresh signal generating unit 420 includes a plurality of NOR gates NOR1 to NOR3, a plurality of inverters IV2 to IV5, and a delay unit 421.

The NOR gate NOR1 logically combines an active signal S1 and an output of the NOR gate NOR2. The NOR gate NOR2 logically combines a refresh command signal S2 and an output of the NOR gate NOR1.

The NOR gates NOR1 and NOR2 comprise a latch. As shown in FIG. 5B, the bank active signal S1 is a pulse signal related to bank active signals generated by receiving an auto refresh command. The refresh command signal S2 is a signal generated after a predetermined time since a refresh command has been input from the external.

The inverter IV2 reverses the output of the NOR gate NOR1 and outputs a refresh signal AREF_EN_PRE. The inverters IV3 and IV4 delay the refresh signal AREF_EN_PRE. The delay unit 421 delays the output of the inverter IV4 for a predetermined time. The NOR gate NOR3 logically combines the output of the inverter IV4 and the output of the delay unit 421. The inverter IV5 reverses the output of the NOR gate NOR3 and outputs an auto refresh signal AREF_EN.

The operation of the semiconductor device in accordance with the embodiment of the present invention will be explained hereinafter.

The VPP detecting unit 100 detects whether the high voltage VPP reaches the target level and enables the high enable signals VPP_EN0 to VPP_EN3 if the high voltage VPP doest not reach the target level.

The active VPP generating units 200 to 230 respectively perform a pumping operation according to the high enable signals VPP_EN0 to VPP_EN3. If the high enable signal VPP_EN(S) becomes enabled because the high voltage VPP does not reach the target level, the high enable signal VPP_EN0 does not become enabled unless the bank B0 is not enabled. Thus, the active VPP generating unit 200 does not operate.

The VDD detecting unit 410 compares the level of the power supply voltage VDD with the preset reference voltage VREF and thus, outputs the detection signal VDD_LOW.

If the bias signal VBIAS is enabled, the NMOS transistor N3 is turned on. Accordingly, a voltage of the node C in which the power supply voltage VDD is assigned by dividing the power supply voltage VDD into resistances R1 and R2 is compared with the reference voltage VREF. If the voltage of the node C is lower than the reference voltage VREF, the detection signal VDD_LOW is output as a logic high level.

If the power supply voltage VDD ranges within a target level, the voltage of the node C has a level higher than the reference voltage VREF. Accordingly, the node E is at a logic high level and, thus, the detection signal VDD_LOW becomes a logic low level. If the power supply voltage VDD becomes lower due to external factors or an increase in the current consumption, the voltage of the node C simultaneously drops. Accordingly, the detection signal VDD_LOW attains a logic high level. A divided voltage of the power supply voltage VDD to change the level of the detection signal VDD_LOW can be controlled by controlling the resistances R1 and R2:

The auto refresh generating unit 420 outputs the auto refresh signal AREF_EN as the logic high level only in response to the auto refresh operation according to the bank active signal S1 and the refresh command signal S2.

As shown in FIG. 5B, the refresh signal AREF_EN_PRE is enabled in synchronism with a rising edge of the bank active signal S1 and is disabled in synchronism with a rising edge of the refresh command signal S2. The auto refresh signal AREF_EN is enabled in synchronism with a rising edge of the bank active signal S1. The auto refresh signal AREF_EN becomes disabled after being delayed for a predetermined time as much as the delay unit 421 delays from the rising edge of the refresh command signal S2 to increase a period in which the auto refresh signal AREF_EN is enabled.

The enable signal generating unit 430 enables the auto refresh high enable signal VDD_EN(IDD5) if all of the high enable signal VPP_EN input from the high voltage detecting unit 100, the detection signal VDD-LOW and the auto refresh signal AREF_EN are enabled.

The VPP generating unit 500 can perform the high operation regardless of whether the banks B0 to B3 are enabled or not if the auto refresh high enable signal VDD_EN(IDD5) is enabled.

As a result, the high voltage generating unit 500 for the auto refresh operation can operate under the following conditions.

First, the high voltage generating unit 500 becomes enabled if the auto refresh signal AREF_EN is enabled in the logic high level during the auto refresh operation.

Secondly, the VPP generating unit 500 operates if the power supply voltage VDD is lower than a certain level and the detection signal VDD_LOW is enabled in the logic high level. If the VPP generating unit 500 operates when the power supply voltage VDD is high, a pumping operation which pumps electric charges is excessively performed to generate the high voltage and unnecessary power consumption can be generated.

In summary, the high voltage generating unit 500 for the auto refresh operation can operate when the power supply voltage VDD is lower than the certain level during the auto refresh operation, and the high voltage VPP is lower than the target level.

As described above, the VPP generating unit is enabled regardless of whether a certain bank is enabled or not if a level of a power supply voltage VDD is low by detecting a range of the power supply voltage VDD during an auto refresh operation. As a result, the VPP generating unit 500 can improve a driving force of a high voltage during the auto refresh operation and prevent excessive power consumption. Accordingly, a whole area of the high voltage generating unit can be reduced.

The present application contains subject matter related to the Korean patent application No. KR 2005-0091672, and 2006-0029651, respectively filed in the Korean Patent Office on Sep. 29, 2005, and Mar. 31, 2006 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A high voltage generator, comprising:
   a high voltage detecting unit for detecting a level of a high voltage and outputting a high enable signal;
   an auto refresh control unit for enabling an auto refresh high enable signal in response to a detection signal enabled when a level of a power supplying voltage is lower than a certain level and in response to the high enable signal during an auto refresh operation; and a high voltage generating unit for generating a high voltage by performing a pumping operation in response to the auto refresh high enable signal.

2. The high voltage generator of claim 1, wherein the auto refresh control unit comprises:
 a power supply voltage detecting unit for comparing the power supply voltage with a reference voltage having a certain level and outputting the detection signal according to the comparison result;
 an auto refresh signal generating unit for generating an auto refresh signal according to a bank active signal and a refresh command signal; and
 an enable signal generating unit for logically combining the high enable signal, the detection signal and the auto refresh signal and outputting the auto refresh high enable signal.

3. The high voltage generator of claim 2, wherein the power supply voltage detecting unit comprises:
 a resistance dividing unit for dividing the power supply voltage; and
 a comparing unit for comparing an output of the resistance dividing unit and the reference voltage.

4. The high voltage generator of claim 3, wherein the resistance dividing unit comprises a plurality of resistances coupled in series between an input terminal of the power supply voltage and a ground voltage terminal.

5. The high voltage generator of claim 3, wherein the comparing unit comprises:
 a differential amplifier for comparing the output of the resistance dividing unit and the reference voltage at activation of a bias signal; and
 a reversing unit for reversing an output of the differential amplifier and outputting the detection signal.

6. The high voltage generator of claim 2, wherein the auto refresh signal generating unit is enabled in synchronism with a rising edge of the bank active signal and is disabled after being delayed for a predetermined time from a rising edge of the refresh command signal.

7. The high voltage generator of claim 6, wherein the auto refresh signal generating unit comprises:
 a latch for latching the bank active signal and the refresh command signal;
 a first inverter for reversing an output of the latch and outputting a refresh signal;
 a first inverter unit for delaying the refresh signal without reversing the refresh signal;
 a delay unit for delaying an output of the first inverter unit for a predetermined time;
 a first NOR gate for logically combining the output of the first inverter unit and the output of the delay unit; and
 a second inverter unit for reversing the output of the first NOR gate and generating the auto refresh signal.

8. The high voltage generator of claim 7, wherein the refresh signal is enabled in synchronism with a rising edge of the bank active signal and is disabled in synchronism with a rising edge of the refresh command signal.

9. The high voltage generator of claim 7, wherein the latch includes the NOR gates.

10. The high voltage generator of claim 2, wherein the bank active signal comprises all of the bank active signals generated by inputting the auto refresh signal.

11. The high voltage generator of claim 2, wherein the refresh command signal is a signal generated after a predetermined time since a refresh command has been input from the external.

12. The high voltage generator of claim 2, wherein the enable signal generating unit logically combines the high enable signal, the detection signal and the auto refresh signal and outputs the auto refresh high enable signal.

13. A high voltage generator, comprising:
 a high voltage generating unit for generating a high voltage by performing a pumping operation in response to an auto refresh high enable signal and a result of comparing the high voltage with a reference voltage;
 a plurality of banks including a plurality of memory cell arrays and supplying the high voltage to the memory cell arrays;
 a high voltage detecting unit for detecting a level of a high voltage to generate a detection signal; and
 an auto refresh control unit for enabling the auto refresh high enable signal in response to a detection signal enabled when a level of a power supplying voltage is lower than a certain level.

14. The high voltage generator of claim 13, wherein the auto refresh control unit comprises:
 a power supply voltage detecting unit for comparing the power supply voltage with a reference voltage having a certain level and outputting the detection signal according to the comparison result;
 an auto refresh signal generating unit for generating an auto refresh signal according to a bank active signal and a refresh command signal; and
 an enable signal generating unit for logically combining the high enable signal, the detection signal and the auto refresh signal and outputting an auto refresh high enable signal.

15. The high voltage generator of claim 13, wherein the power supply voltage detecting unit comprises:
 a resistance dividing unit for dividing the power supply voltage; and
 a comparing unit for comparing an output of the resistance dividing unit with the reference voltage.

16. The high voltage generator of claim 15, wherein the resistance dividing unit comprises a plurality of resistances coupled in series between an input terminal of the power supply voltage and a ground voltage terminal.

17. The high voltage generator of claim 15, wherein the comparing unit comprises:
 a differential amplifier for comparing an output of the resistance dividing unit with the reference voltage at activation of a bias signal; and
 a reversing unit for reversing an output of the differential amplifier and outputting the detection signal.

18. The high voltage generator of claim 17, wherein the auto refresh signal generating unit is enabled in synchronism with a rising edge of the bank active signal and is disabled after being delayed for a predetermined time from a rising edge of the refresh command signal.

19. The high voltage generator of claim 18, wherein the auto refresh signal generating unit comprises:
 a latch for latching the bank active signal and the refresh command signal;
 a first inverter for reversing an output of the latch and outputting the refresh signal;
 a first inverter unit for delaying the refresh signal;
 a delay unit for delaying an output of the inverter unit for a predetermined time;
 a first NOR gate for logically combining an output of the first inverter unit and an output of the delay unit; and
 a second inverter for reversing an output of the first NOR gate and generating the auto refresh signal.

20. The high voltage generator of claim 19, wherein the refresh signal is enabled in synchronism with a rising edge of the bank active signal and is disabled in synchronism with a rising edge of the refresh command signal.

21. The high voltage generator of claim 19, wherein the latch includes the NOR gates.

22. The high voltage generator of claim 14, wherein the bank active signal comprises all of the bank active signals generated by inputting the auto refresh signal.

23. The high voltage generator of claim 14, wherein the refresh command signal is a signal generated after a predetermined time since a refresh command has been input from the external.

24. The high voltage generator of claim 14, wherein the enable signal generating unit logically combines the high enable signal, the detection signal and the auto refresh signal and outputs the auto refresh high enable signal.

25. The high voltage generator of claim 13, further comprising high enable signal; and a plurality of active high voltage generating units for performing high operations according to the high enable signal and bank activation information input from the banks.

26. The high voltage generator of claim 13, wherein each of the banks is assigned to one or more active high voltage generating units.

* * * * *